United States Patent [19]

Lampkin

[11] 3,971,672
[45] July 27, 1976

[54] LIGHT DIFFUSER FOR PHOTOVOLTAIC CELL

[75] Inventor: Curtis M. Lampkin, El Paso, Tex.

[73] Assignee: D. H. Baldwin Company, Cincinnati, Ohio

[22] Filed: Feb. 3, 1975

[21] Appl. No.: 546,711

[52] U.S. Cl. ............................................. 136/89
[51] Int. Cl.² ........................................ H01L 31/04
[58] Field of Search ..................................... 136/89

[56] References Cited
UNITED STATES PATENTS

| | | | |
|---|---|---|---|
| 2,904,612 | 9/1959 | Regnier | 136/89 |
| 3,880,633 | 4/1975 | Jordan et al. | 65/60 |

Primary Examiner—John H. Mack
Assistant Examiner—Aaron Weisstuch
Attorney, Agent, or Firm—Kirkland & Ellis

[57] ABSTRACT

A photovoltaic system in which strips of active photovoltaic cells are coated on one side of a sheet of glass, the glass being illuminated by the sun from the other side of the sheet and the strips being separated by inactive areas devoted to electrodes, in which light diffusing areas are provided on said other side of the sheet of glass in superposition of the inactive areas in order to refract sunlight which would otherwise fall wholly on the inactive areas, on large part to the active areas of the cells.

5 Claims, 2 Drawing Figures

LIGHT DIFFUSER FOR PHOTOVOLTAIC CELL

BACKGROUND OF THE INVENTION

Photovoltaic cells are known, which include strips of coated materials which form photovoltaic junctions, the coatings being on a glass substrate which may be exposed to sunlight via the uncoated surface of the glass. In order that such cells shall be commercially feasible they must be capable of fabrication in large areas, and they must have high efficiencies in order that their cost of fabrication in dollars and energy consumption may be recouped in a relatively short time, and they must have long life. Efficiency of photovoltaic cells derives in part from efficiency in terms of rate of conversion of sunlight to electrical energy, in terms of electrical losses within the cells and in the connections which must be made with the outside world, and in area efficiency, i.e., the proportion of the system area which is devoted to production of energy is a function of total area of glass, taking into account that some part of the glass surface must be devoted to leads and not to active photovoltaic area. In the type of cell here contemplated, the cadmium sulphide cell, strips of cadmium sulphide are applied to a tin oxide coating previously applied to a glass surface. The cadmium sulphide layer may be about 2 microns thick. Over the cadmium sulphide layer is deposited, as by electrodeposition, a layer of copper sulphide, which forms a heterojunction with the cadmium sulphide. Electrodes are deposited on the copper sulphide, and the spaces between the strips are provided with elongated electrodes extending along the channels. These channels are necessary but they do not contribute to power output. Electricity must flow through the channels, and in so doing introduces electrical losses. Therefore, the tin oxide must have low resistivity, i.e., ohms per square. But, also the total current path lengths must be maintained small, so that the widths of the active layers of the cell are limited by considerations of electrical efficiency. Light which falls on the channels is wasted, and this reduces output per square of glass, everything else being equal. Pursuant to present design about 15% of light flux is wasted. The latter waste can be in major part avoided by providing a diffusing surface superposed over the channels, and such surfaces can be readily formed by etching or sand blasting the glass surface where diffusion is required. The diffusing surface refracts about 75% of the sunlight, which would otherwise fall on the inactive areas of the cell, to the active areas.

SUMMARY OF THE INVENTION

A glass substrate cadmium sulfide solar cell, the active areas of which are irradiated by sunlight through the glass substrate, in which inefficiency due to presence of inactive areas of the cell is reduced by irradiating the inactive areas through a diffusing surface formed on the glass, which diverts radiation to the active areas.

DETAILED DISCLOSURE

Figure 1:
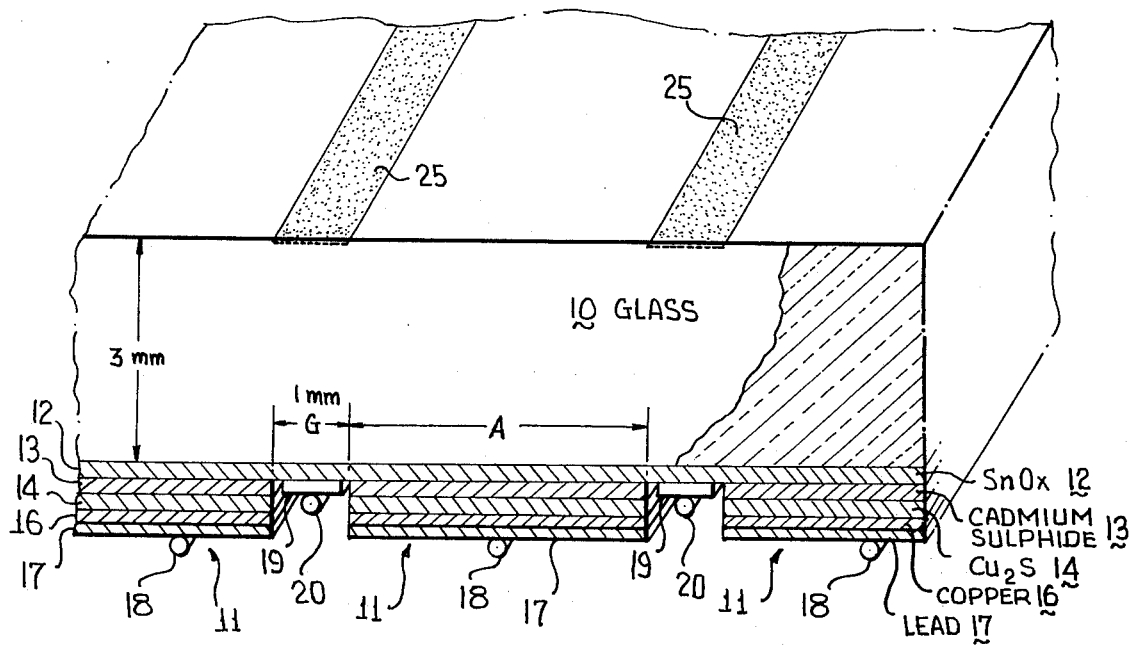
FIG. 1 is a view in transverse section of a solar cell according to the prior art.

In FIG. 1, 10 is a sheet of glass 3 mms. thick, having on its underside arrays of photovoltaic cells 11. The entire underside is coated with a thin transparent layer 12 of tin oxide, $SnO_x$, where $x$ indicates that the precise relation of oxygen to tin is unknown, but where $x$ is about 1.9. Coated on the tin oxide are elongated strips 13 including cadmium sulphide incorporating aluminum, according to the teaching of U.S. patent application Ser. No. 431,705, now U.S. Pat. No. 3,880,633, in the names of Jordan and Lampkin, filed and assigned to the assignee of this application. The widths of the strips 13 are A, the strips being separated by spaces of width G, where G is about 1 mm., and where $(G + A)/A = 0.85$, as exemplary values. On the cadmium sulphide, which forms microcrystals about 2 microns thick perpendicular to the glass, is a thin layer of cuprous sulphide 14, which with the cadmium sulphide forms a photovoltaic heterojunction. The $SnO_x$ now provides a negative electrode. Coated over the cuprous sulphide is a layer of copper 16, and over the latter is coated a layer of lead 17, to protect the copper from oxidation. The lead is inert and does not oxidize, it forms a perfectly adherent seal to the copper, and leads can be readily soldered to it. Such copper leads are 18. In order to make contact to the tin oxide layer 12, a strip of inconel 19 is laid down between the photovoltaic strips, on the tin, and to the inconel is soldered copper wires 20.

The sun appears to the photovoltaic cells as a point source of radiation, and the cells are oriented parallel to the daily path of the sun.

It is now true that about 15% of the area of the glass is not occupied by heterojunctions, since that much area is allocated to negative electrodes. This reduces the possible efficiency of an array of cells, in terms of conversion efficiency of sunlight to electricity, by 15%.

In accordance with the present invention the upper surface of the glass is provided with radiation diffusing strips 25, by etching strips of the glass, or by sandblasting, the strips 25 being of width G, and being directly superposed over the non-production areas of the under surface of the glass. The glass is 3 mms. thick and the widths of the diffusing strip are 1 mm., and it can be shown that about 75% of the light falling on the diffusing strip will be diverted to the active areas of the cells and about 25% will fall on the inactive spaces despite the diffusers.

If area efficiency is 85% in absence of the diffusers, which is the case for the exemplary dimensions, the inclusion of a diffuser increases area efficiency to about 95%.

Figure 2:
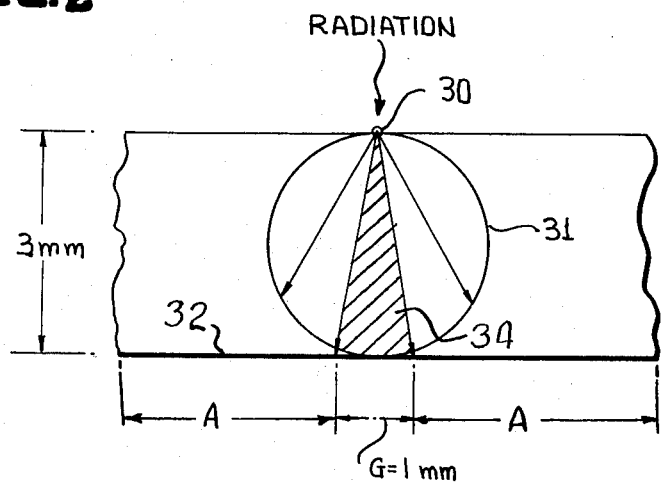
FIG. 2 is a plot of intensity of irradiated energy subject to refraction by a diffusing surface.

With reference to FIG. 2, the operation of a diffuser is governed by Lambert's law, in accordance with which the intensity of light, from a diffusing point 30, is, for any direction, as the chord of a circle 31 having a diameter equal to the separation between the point 30 and a light receiving surface 32. This is illustrated in FIG. 2, in which the cross hatched area of the circle 31, 34, represents that part of the area of 31 which corresponds with light flux falling on the inactive areas G of a cell. The remainder of the area of circle 31 then represents the light flux which is diverted to the active areas A by the diffuser. FIG. 2 presents a simplified picture for a line diffuser. In fact, the diffuser is of finite width. This fact does not detract from the results attained, but in fact enhances the improvement.

It should be noted that, although diffusing strips 25 take on the configuration of rectangular strips in the preferred embodiment, this configuration is not critical. Any configuration appropriate to the array of photovoltaic cells with which the diffusing means is associated may be utilized.

What I claim is:

1. A solar cell, including a sheet glass substrate, plural actice photo-sensitive strips coated on one planar surface of said substrate, said active strips being separated by inactive areas and having diffusing surfaces superposed over said inactive areas on the other planar surface of said substrate, whereby radiation passing directly through said substrate to said active strips is undiffused and radiation passing through said diffusing surfaces is refracted in part to said active strips.

2. The combination according to claim 1, wherein said inactive areas include $SnO_x$ coated on said substrate and providing a negative electrode, and wherein said active strips include $CdS_2$-$CU_2S$ microcrystalline photovoltaic heterojunctions.

3. In a photovoltaic system of the type having a transparent substrate, plural active photo-sensitive areas coated on one planar surface of said substrate, and inactive areas adjacent to said active photosensitive areas, the combination with said substratee of a diffusing means superposed over and in a plane essentially parallel with said inactive areas and of such configuration so that radiation passing through said diffusing means is diffused in part from said inactive areas to said photo-sensitive areas.

4. The combination according to claim 3, wherein said diffusing means comprises an abraded portion of said substrate.

5. The combination according to claim 3, wherein said diffusing means comprises an etched portion of said substrate.

* * * * *